United States Patent
De Rege Thesauro et al.

(10) Patent No.: US 7,288,021 B2
(45) Date of Patent: Oct. 30, 2007

(54) CHEMICAL-MECHANICAL POLISHING OF METALS IN AN OXIDIZED FORM

(75) Inventors: Francesco De Rege Thesauro, Naperville, IL (US); Vlasta Brusic, Geneva, IL (US); Benjamin P. Bayer, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 10/753,138

(22) Filed: Jan. 7, 2004

(65) Prior Publication Data

US 2005/0148290 A1  Jul. 7, 2005

(51) Int. Cl.
*B24B 1/00* (2006.01)
*B24B 7/19* (2006.01)
*B24B 7/30* (2006.01)
*B24C 1/00* (2006.01)

(52) U.S. Cl. ............................ 451/41; 451/56; 451/60; 451/36

(58) Field of Classification Search ...................... None
See application file for complete search history.

(56) References Cited

U.S. PATENT DOCUMENTS

| | | | |
|---|---|---|---|
| 2,312,875 A * | 3/1943 | Bunting et al. ............. 430/367 |
| 3,826,756 A * | 7/1974 | Bachmann et al. .......... 264/4.7 |
| 4,294,608 A * | 10/1981 | Sedlak et al. ............... 420/462 |
| 5,489,233 A | 2/1996 | Cook et al. |
| 5,527,423 A | 6/1996 | Neville et al. |
| 5,683,443 A * | 11/1997 | Munshi et al. .............. 607/121 |
| 5,691,219 A | 11/1997 | Kawakubo et al. |
| 5,783,489 A * | 7/1998 | Kaufman et al. ........... 438/692 |
| 5,958,794 A | 9/1999 | Bruxvoort et al. |
| 6,117,783 A | 9/2000 | Small et al. |
| 6,139,763 A * | 10/2000 | Ina et al. ...................... 216/89 |
| 6,274,063 B1 | 8/2001 | Li et al. |
| 6,290,736 B1 | 9/2001 | Evans |
| 6,313,039 B1 | 11/2001 | Small et al. |
| 6,315,803 B1 | 11/2001 | Ina et al. |
| 6,326,305 B1* | 12/2001 | Avanzino et al. ........... 438/687 |
| 6,419,554 B2 | 7/2002 | Chopra et al. |
| 6,454,822 B1* | 9/2002 | Rosenflanz .................. 51/309 |
| 6,527,622 B1 | 3/2003 | Brusic et al. |
| 7,087,104 B2* | 8/2006 | Choi et al. .................. 106/1.22 |
| 2002/0039839 A1 | 4/2002 | Thomas et al. |
| 2002/0042208 A1* | 4/2002 | Beitel et al. ................ 438/745 |
| 2002/0086511 A1* | 7/2002 | Hartner et al. .............. 438/608 |
| 2002/0090820 A1* | 7/2002 | Sun et al. .................... 438/690 |
| 2002/0102923 A1 | 8/2002 | Sugiyama et al. |
| 2002/0111027 A1 | 8/2002 | Sachan et al. |
| 2002/0132042 A1* | 9/2002 | Merricks et al. .............. 427/98 |
| 2002/0182982 A1* | 12/2002 | Li et al. ........................ 451/41 |
| 2003/0013387 A1* | 1/2003 | Tsai et al. ..................... 451/41 |
| 2003/0107465 A1* | 6/2003 | Hiraoka et al. ............... 338/13 |
| 2003/0119319 A1 | 6/2003 | Sinha et al. |
| 2004/0029495 A1* | 2/2004 | Small et al. ................... 451/41 |
| 2004/0132385 A1* | 7/2004 | Kitayama et al. ............. 451/41 |
| 2004/0248405 A1* | 12/2004 | Fukunaga et al. ........... 438/637 |
| 2005/0006339 A1* | 1/2005 | Mardilovich et al. ......... 216/39 |

FOREIGN PATENT DOCUMENTS

| | | |
|---|---|---|
| JP | 63096599 A2 | 4/1988 |
| JP | 01270512 A2 | 10/1989 |
| JP | 11121411 A2 | 4/1999 |
| WO | WO 00/77107 A1 | 12/2000 |
| WO | WO 01/44396 A1 | 6/2001 |
| WO | WO 02/063669 A2 | 8/2002 |
| WO | WO 03/064551 A1 | 8/2003 |

OTHER PUBLICATIONS

Buxton et al., "Critical Review of Rate Constants for Reactions of Hydrated Electrons, Hydrogen Atoms and Hydroxyl Radicals (OH/O-) in Aqueous Solution," *J. Phys. Chem. Ref. Data* 17: 513-531 (1988).

* cited by examiner

*Primary Examiner*—Joseph J. Hail, III
*Assistant Examiner*—Bryan R. Muller
(74) *Attorney, Agent, or Firm*—Thomas Omholt; Steven Weseman; Francis J. Koszyk

(57) ABSTRACT

The invention provides a method for polishing a substrate comprising a metal in an oxidized form, the method comprising the steps of: (a) providing a substrate comprising a metal in an oxidized form, (b) contacting a portion of the substrate with a chemical-mechanical polishing system comprising: (i) a polishing component, (ii) a reducing agent, and (iii) a liquid carrier, and (c) abrading at least a portion of the metal in an oxidized form to polish the substrate. The reducing agent can be selected from the group consisting of 3-hydroxy-4-pyrones, α-hydroxy-γ-butyrolactones, ascorbic acid, borane, borohydrides, dialkylamine boranes, formaldehyde, formic acid, hydrogen, hydroquinones, hydroxylamine, hypophosphorous acid, phosphorous acid, a metal or metal ions in an oxidation state having a standard redox potential that is less than the standard redox potential of the metal in an oxidized form, trihydroxybenzenes, solvated electrons, sulfurous acid, salts thereof, and mixtures thereof.

30 Claims, No Drawings

CHEMICAL-MECHANICAL POLISHING OF METALS IN AN OXIDIZED FORM

FIELD OF THE INVENTION

This invention pertains to compositions and methods for the chemical-mechanical polishing of metals, especially metals in an oxidized form.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing microelectronic devices. In particular, polishing compositions and polishing pads can have less than desirable polishing rates, and their use in the chemical-mechanical polishing of microelectronic devices can result in poor surface quality. Because the performance of a microelectronic device is directly associated with the planarity of its surface, it is crucial to use a polishing composition and method that results in a high polishing efficiency, uniformity, and removal rate and leaves a high quality polish with minimal surface defects.

The difficulty in creating an effective polishing system for microelectronic devices stems from the complexity of the typical microelectronic device. Microelectronic devices, such as semiconductor wafers or memory devices, typically are composed of a substrate, on which a plurality of transistors has been formed. Integrated circuits are chemically and physically connected into a substrate by patterning regions in the substrate and layers on the substrate. To produce an operable semiconductor wafer or memory device and to maximize the yield, performance, and reliability of the wafer or device, it is desirable to polish select surfaces of the wafer or device without adversely affecting underlying structures or topography. In fact, various problems in semiconductor and/or memory fabrication can occur if the process steps are not performed on surfaces that are adequately planarized.

Various metals and metal alloys have been used to form electrical connections between devices, including titanium, titanium nitride, aluminum-copper, aluminum-silicon, copper, tungsten, platinum, platinum-tungsten, platinum-tin, ruthenium, and combinations thereof. Noble metals present a particular challenge in that they are mechanically hard and chemically resistant, making them difficult to remove efficiently through chemical-mechanical polishing.

The following patents and published patent applications disclose polishing compositions for noble metals. U.S. Pat. No. 5,691,219 discloses a semiconductor memory device comprising a noble metal conductive layer and a polishing composition comprising a halo-compound for polishing the noble metal. U.S. Pat. No. 6,274,063 discloses polishing compositions for nickel substrates comprising a chemical etchant (e.g., aluminum nitrate), abrasive particles, and an oxidizer. U.S. Pat. No. 6,290,736 discloses a chemically active polishing composition for noble metals comprising an abrasive and a halogen in basic aqueous solution. JP 63096599 A2 discloses a method of dissolving metallic ruthenium. JP 11121411 A2 discloses a polishing composition for platinum group metals (e.g., Ru, Pt) comprising fine particles of an oxide of the platinum group metal. JP 01270512 A2 discloses a dissolving solution for noble metals comprising hydrogen peroxide, alkali cyanide, and phosphate ion and/or borate ion. WO 00/77107 A1 discloses a polishing composition for noble metals (e.g., Ru, Rh, Pd, Os, Ir, Pt) comprising an abrasive, a liquid carrier, an oxidizer, and a polishing additive that can include EDTA, nitrogen-containing macrocycles (e.g., tetraazacyclotetradecanes), crown ethers, halides, cyanides, citric acid, phosphines, and phosphonates. WO 01/44396 A1 discloses a polishing composition for noble metals comprising sulfur-containing compounds, abrasive particles, and water-soluble organic additives which purportedly improve the dispersion of the abrasive particles and enhance metal removal rates and selectivity.

While the aforementioned polishing compositions may be capable of polishing metals (e.g. noble metals) at desirable rates, they are not very effective at polishing metals in an oxidized form, such as iridium oxide. However, the use of such oxidized metals is becoming increasingly popular. For example, oxidized metals (i.e., metals in an oxidized form) have been and continue to be used in integrated circuits, memory devices (e.g., ferroelectric random-access memory), micro-electrical-mechanical systems (MEMS), and micro-electrical-optical systems (MEOS)). More specifically, iridium oxide ($IrO_2$) currently is used as a barrier/adhesion layer in certain ferroelectric random-access memory (FeRAM) capacitor schemes. Despite the prevalence of such uses, very few commercially available polishing systems and known polishing methods can be used to effectively and efficiently polish a substrate comprising an oxidized metal (i.e., a metal in an oxidized form).

Accordingly, a need remains for polishing systems and polishing methods that will exhibit desirable planarization efficiency and/or removal rate during the polishing and planarization of substrates comprising a metal in an oxidized form. Improved polishing systems and methods are particularly needed for the polishing of substrates comprising chemically stable and mechanically hard noble metals in an oxidized form. The invention provides such a polishing system and polishing method. These and other advantages of the invention, as well as additional inventive features, will be apparent from the description of the invention provided herein.

BRIEF SUMMARY OF THE INVENTION

The invention provides a method for polishing a substrate comprising a metal in an oxidized form, the method comprising the steps of: (a) providing a substrate comprising a metal in an oxidized form, (b) contacting a portion of the substrate with a chemical-mechanical polishing system comprising: (i) a polishing component selected from the group consisting of an abrasive, a polishing pad, and a combination thereof, (ii) a reducing agent selected from the group consisting of 3-hydroxy-4-pyrones, α-hydroxy-γ-butyrolactones, borane, borohydrides, dialkylamine boranes, formaldehyde, formic acid, hydrogen, hydroquinones, hydroxylamine, hypophosphorous acid, trihydroxybenzenes, solvated electrons, sulfurous acid, salts thereof, and mixtures thereof, and (iii) a liquid carrier, and (c) abrading at least a portion of the metal in an oxidized form to polish the substrate.

The invention also provides a method for polishing a substrate comprising a metal in an oxidized form, the method comprising the steps of: (a) providing a substrate comprising a metal in an oxidized form, (b) contacting a portion of the substrate with a chemical-mechanical polishing system comprising: (i) a polishing component selected from the group consisting of an abrasive, a polishing pad, and a combination thereof, (ii) about 0.1 to about 1 wt. % of a reducing agent based on the weight of the liquid carrier and any components dissolved or suspended therein, the reducing agent being selected from the group consisting of 3-hydroxy-4-pyrones, α-hydroxy-γ-butyrolactones, ascorbic acid, borane, borohydrides, dialkylamine boranes, formaldehyde, formic acid, hydrogen, hydroquinones, hydroxylamine, hypophosphorous acid, trihydroxybenzenes, solvated electrons, sulfurous acid, salts thereof, and mixtures thereof, and (iii) a liquid carrier, and (c) abrading at least a portion of the metal in an oxidized form to polish the substrate.

The invention further provides a method for polishing a substrate comprising a metal in an oxidized form, the method comprising the steps of: (a) providing a substrate comprising a metal in an oxidized form, (b) contacting a portion of the substrate with a chemical-mechanical polishing system comprising: (i) a polishing component selected from the group consisting of an abrasive, a polishing pad, and a combination thereof, (ii) a reducing agent selected from the group consisting of 3-hydroxy-4-pyrones, α-hydroxy-γ-butyrolactones, borane, borohydrides, dialkylamine boranes, formaldehyde, formic acid, hydrogen, hydroquinones, hydroxylamine, hypophosphorous acid, a metal or metal ions in an oxidation state having a standard redox potential that is less than the standard redox potential of the metal in an oxidized form, trihydroxybenzenes, solvated electrons, sulfurous acid, salts thereof, and mixtures thereof, and (iii) a liquid carrier, wherein the polishing system does not comprise an oxidizing agent, and (c) abrading at least a portion of the metal in an oxidized form to polish the substrate.

Lastly, the invention provides a method for polishing a substrate comprising a metal in an oxidized form, the method comprising the steps of: (a) providing a substrate comprising a metal in an oxidized form, (b) contacting a portion of the substrate with a chemical-mechanical polishing system comprising: (i) a polishing component selected from the group consisting of an abrasive, a polishing pad, and a combination thereof, wherein the polishing component does not comprise a mixture of α-alumina and fumed alumina, (ii) a reducing agent selected from the group consisting of 3-hydroxy-4-pyrones, α-hydroxy-γ-butyrolactones, borane, borohydrides, dialkylamine boranes, formaldehyde, formic acid, hydrogen, hydroquinones, hydroxylamine, hypophosphorous acid, phosphorous acid, a metal or metal ions in an oxidation state having a standard redox potential that is less than the standard redox potential of the metal in an oxidized form, trihydroxybenzenes, solvated electrons, sulfurous acid, salts thereof, and mixtures thereof, and (iii) a liquid carrier, and (c) abrading at least a portion of the metal in an oxidized form to polish the substrate.

DETAILED DESCRIPTION OF THE INVENTION

The invention provides a method for polishing a substrate comprising a metal in an oxidized form, the method comprising the steps of: (a) providing a substrate comprising a metal in an oxidized form, (b) contacting a portion of the substrate with a chemical-mechanical polishing system comprising: (i) a polishing component selected from the group consisting of an abrasive, a polishing pad, and a combination thereof, (ii) a reducing agent, and (iii) a liquid carrier, and (c) abrading at least a portion of the metal in an oxidized form to polish the substrate.

The method of the invention can be used to polish any suitable substrate (e.g., integrated circuit, memory or rigid disk, metal, interlevel dielectric (ILD) layer, semiconductor, micro-electro-mechanical system, ferroelectric, magnetic head, polymeric film, and low or high dielectric constant film) comprising a metal in an oxidized form. It will be understood that suitable substrates can be provided in a configuration comprising at least one layer of the metal in an oxidized form and other layers comprising other materials, such as a metal, a different metal in an oxidized form, or an insulating material. For example, the substrate can comprise an insulating layer comprising any suitable insulating material, such as a metal oxide, porous metal oxide, glass, organic polymer, fluorinated organic polymer, or any other suitable high or low-κ insulating material. When present in the substrate, the insulating layer preferably comprises a silicon-based metal oxide.

As utilized herein, the term "metal in an oxidized form" refers to any metal in which at least a portion of the metal atoms possess fewer electrons than the elemental metal (i.e., the metal has been chemically oxidized). The metal can be in any suitable oxidized form. Suitable oxidized forms include, but are not limited to, oxides, nitrides, borides, sulfides, and mixtures thereof. The metal in an oxidized form can have any suitable molecular formula. For example, when the metal in an oxidized form is an oxide, the metal in an oxidized form can have the molecular formula $M_xO_y$, where M represents the metal and y, which is an integer representing the number of oxygen atoms in the smallest molecular unit of the metal in an oxidized form, is greater than or equal to x, which is an integer representing the number of metal atoms in the smallest molecular unit of the metal in an oxidized form.

The metal can be any suitable metal. For example, the metal can be tantalum, and the metal in an oxidized form can be a tantalum oxide (e.g., tantalum pentoxide). Preferably, the metal is a noble metal. The noble metal can be any suitable noble metal, but preferably is selected from the group consisting of platinum, iridium, ruthenium, rhodium, palladium, silver, osmium, gold, and combinations thereof. Most preferably, the noble metal is iridium, and the metal in an oxidized form is iridium oxide ($IrO_2$).

As noted above, the chemical-mechanical polishing system comprises a polishing component selected from the group consisting of an abrasive, a polishing pad, or a combination thereof. The chemical-mechanical polishing system described herein desirably comprises an abrasive and a polishing pad. The abrasive can be in any suitable form (e.g., abrasive particles). The abrasive can be fixed on the polishing pad and/or can be in particulate form and suspended in the liquid carrier. The polishing pad can be any suitable polishing pad. The abrasive (when suspended in the liquid carrier) and the reducing agent, as well as any other components suspended in the liquid carrier, form the polishing composition of the chemical-mechanical polishing (e.g., CMP) system.

The abrasive can be any suitable abrasive. For example, the abrasive can be natural or synthetic, and can comprise certain hard polymers (e.g., polycarbonates), diamond (e.g., polycrystalline diamond), garnet, glass, carborundum, metal oxide, carbide, nitride, and the like. The abrasive desirably comprises a metal oxide. Suitable metal oxides include metal oxides selected from the group consisting of alumina, silica, ceria, zirconia, titania, germania, co-formed products thereof, and combinations thereof. Preferably, the metal oxide is selected from the group consisting of alumina, silica, ceria, and combinations thereof. More preferably, the metal oxide comprises silica, alumina (e.g., fumed alumina or α-alumina), or a combination thereof. Most preferably, the metal oxide comprises α-alumina. When the abrasive comprises α-alumina, the abrasive can also comprise other forms of alumina, such as fumed alumina. The α-alumina, when present, can comprise any suitable amount of the abrasive (e.g., about 1 wt. % or more up to about 100 wt. % of the abrasive based on the total weight of the abrasive). Preferably, the α-alumina comprises about 60 wt. % or more (e.g., about 65 wt. % or more, about 70 wt. % or more, about 75 wt. % or more, about 80 wt. % or more, about 85 wt. % or more, about 90 wt. % or more, about 95 wt. % or more) of the abrasive based on the total weight of the abrasive. The abrasive particles typically have an average particle diameter of about 20 nm to about 500 nm. Preferably, the abrasive particles have an average particle diameter of about 70 nm to about 300 nm (e.g., about 100 nm to about 200 nm).

When the abrasive is present in the chemical-mechanical polishing system and is suspended in the liquid carrier (i.e., when the abrasive is a component of the polishing composition), any suitable amount of abrasive can be present in the polishing composition. Typically about 0.1 wt. % or more (e.g., about 0.5 wt. % or more, or about 1 wt. % or more) abrasive will be present in the polishing composition. The amount of abrasive in the polishing composition typically will not exceed about 30 wt. %, more typically will not exceed about 20 wt. % (e.g., will not exceed about 10 wt. %).

When the abrasive is suspended in the polishing composition, the polishing composition preferably is colloidally stable. The term colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

The average particle size of the polishing composition (e.g., the average size of the abrasive particles suspended in the liquid carrier) preferably remains essentially unchanged throughout the useful life of the polishing composition. In particular, the average particle size of the polishing composition preferably increases by less than about 40% (e.g., less than about 35%, less than about 30%, less than about 25%, less than about 20%, less than about 15%, or less than about 10%) throughout the useful life of the polishing composition (e.g., about 90 days or more, about 180 days or more, or about 365 days or more).

The chemical-mechanical polishing system utilized in the method of the invention can comprise any suitable reducing agent. For example, the reducing agent can be selected from the group consisting of 3-hydroxy-4-pyrones (e.g., 3-hydroxy-2-methyl-4-pyrone), α-hydroxy-γ-butyrolactones, ascorbic acid, borane ($BH_3$), borohydrides, dialkylamine boranes (e.g., dimethylamine borane), formaldehyde, formic acid, hydrogen ($H_2$), hydroquinones (e.g., hydroquinone sulfonic acid), hydroxylamine, hypophosphorous acid ($H_3PO_2$), phosphorous acid ($H_3PO_3$), a metal or metal ions in an oxidation state having a standard redox potential that is less than the standard redox potential of the metal in an oxidized form, trihydroxybenzenes (e.g., 1,2,3-trihydroxybenzene, 1,2,4-trihydroxybenzene, or 1,3,5-trihydroxybenzene), solvated electrons (e.g., hydrated electrons), sulfurous acid ($H_2SO_3$), salts thereof, and mixtures thereof. The reducing metal or metal ions can be any suitable metal or metal ion having a standard redox potential that is less than the standard redox potential of the metal in an oxidized form. Suitable reducing metals or metal ions include, but are not limited to, alkaline earth metals, alkali metals, zinc, iron, $Fe^{2+}$ ions, and combinations thereof. Furthermore, it will be understood that the reducing metals or metal ions can be associated with a suitable complexing agent (e.g., a salt of ethylenediaminetetraacetic acid or propylenediaminetetraacetic acid). As utilized herein, the term "solvated electrons" refers to an electron surrounded by a small number of oriented solvent molecules (e.g., water molecules). Solvated electrons can be produced by a number of different processes, such as the radiolysis of water (e.g., using γ-rays) or the photolysis of an appropriate solute (e.g., $Fe(CN)_6^{4-}$ or $I^-$).

In a preferred embodiment, the reducing agent is selected from the group consisting of 3-hydroxy-4-pyrones (e.g., 3-hydroxy-2-methyl-4-pyrone), α-hydroxy-γ-butyrolactones, borane, borohydrides, dialkylamine boranes (e.g., dimethylamine borane), formaldehyde, formic acid, hydrogen, hydroquinones (e.g., hydroquinone sulfonic acid), hydroxylamine, hypophosphorous acid, trihydroxybenzenes (e.g., 1,2,3-trihydroxybenzene, 1,2,4-trihydroxybenzene, or 1,3,5-trihydroxybenzene), solvated electrons, sulfurous acid, salts thereof, and mixtures thereof. In another preferred embodiment, the reducing agent is selected from the group consisting of dimethylamine borane, formic acid, hydroquinone, hydroquinone sulfonic acid, hydroxylamine, hypophosphorous acid, trihydroxybenzenes (e.g., 1,2,3-trihydroxybenzene, 1,2,4-trihydroxybenzene, or 1,3,5-trihydroxybenzene), salts thereof, and mixtures thereof. Alternatively, such as when the chemical-mechanical polishing system comprises about 0.1 to about 1 wt. % of a reducing agent based on the weight of the liquid carrier and any components dissolved or suspended therein, the reducing agent can be selected from the group consisting of 3-hydroxy-4-pyrones (e.g., 3-hydroxy-2-methyl-4-pyrone), α-hydroxy-γ-butyrolactones, ascorbic acid, borane, borohydrides, dialkylamine boranes (e.g., dimethylamine borane), formaldehyde, formic acid, hydrogen, hydroquinones (e.g., hydroquinone sulfonic acid), hydroxylamine, hypophosphorous acid, trihydroxybenzenes (e.g., 1,2,3-trihydroxybenzene, 1,2,4-trihydroxybenzene, or 1,3,5-trihydroxybenzene), solvated electrons, sulfurous acid, salts thereof, and mixtures thereof. When the chemical-mechanical polishing system does not comprise an oxidizing agent, the reducing agent can be selected from the group consisting of 3-hydroxy-4-pyrones (e.g., 3-hydroxy-2-methyl-4-pyrone), α-hydroxy-γ-butyrolactones, borane, borohydrides, dialkylamine boranes (e.g., dimethylamine borane), formaldehyde, formic acid, hydrogen, hydroquinones (e.g., hydroquinone sulfonic acid), hydroxylamine, hypophosphorous acid, a metal or metal ions in an oxidation state having a standard redox potential that is less than the standard redox potential of the metal in an oxidized form, trihydroxybenzenes (e.g., 1,2,3-trihydroxybenzene, 1,2,4-trihydroxybenzene, or 1,3,5-trihydroxybenzene), solvated electrons, sulfurous acid, salts thereof, and mixtures thereof. In another embodiment, such as when the polishing component of the chemical-mechanical polishing system does not comprise a mixture of α-alumina and fumed alumina, the reducing agent can be selected from the group consisting of 3-hydroxy-4-pyrones (e.g., 3-hydroxy-2-methyl-4-pyrone), α-hydroxy-γ-butyrolactones, borane, borohydrides, dialkylamine boranes (e.g., dimethylamine borane), formaldehyde, formic acid, hydrogen, hydroquinones (e.g., hydroquinone sulfonic acid), hydroxylamine, hypophosphorous acid, phosphorous acid, a metal or metal ions in an oxidation state having a standard redox potential that is less than the standard redox potential of the metal in an oxidized form, trihydroxybenzenes (e.g., 1,2,3-trihydroxybenzene, 1,2,4-trihydroxybenzene, or 1,3,5-trihydroxybenzene), solvated electrons, sulfurous acid, salts thereof, and mixtures thereof.

In order to effectively polish the substrate, the standard redox potential of the reducing agent should be less than the standard redox potential of the metal in an oxidized form. Preferably, at a given pH for the chemical-mechanical polishing system, the redox potential of the reducing agent at such pH is less than the redox potential of the metal in an oxidized form at such pH.

The chemical-mechanical polishing system can comprise any suitable amount of the reducing agent. Typically, the chemical-mechanical polishing system comprises about 0.01 wt. % or more (e.g., about 0.05 wt. % or more, or about 0.1 wt. % or more) reducing agent, based on the weight of the liquid carrier and any components dissolved or suspended therein. The chemical-mechanical polishing system typically comprises about 15 wt. % or less (e.g., about 12 wt. % or less, about 10 wt. % or less, about 8 wt. % or less, or about 5 wt. % or less) reducing agent, based on the weight of the liquid carrier and any components dissolved or dispersed therein. In a preferred embodiment, the chemical-mechanical polishing system comprises about 0.1 to about 5 wt. %, more preferably about 0.1 to about 1 wt. %, and most preferably about 0.1 to about 0.5 wt. % reducing agent, based on the weight of the liquid carrier and any components dissolved or suspended therein.

A liquid carrier is used to facilitate the application of the abrasive (when present in the polishing composition), reducing agent, and any other additives to the surface of a suitable substrate to be polished or planarized. The liquid carrier can be any suitable liquid carrier. Typically, the liquid carrier is water, a mixture of water and a suitable water-miscible solvent, or an emulsion. Preferably, the liquid carrier comprises, consists essentially of, or consists of water, more preferably deionized water.

As noted above, the chemical-mechanical polishing system utilized in the method of the invention comprises a polishing component, a reducing agent having a standard redox potential that is less than the standard redox potential of the metal in an oxidized form (which is part of the substrate), and a liquid carrier. In order to ensure that the reducing agent is available to react with the metal in an oxidized form, the chemical-mechanical polishing system preferably does not comprise a chemical oxidizing agent (e.g., inorganic and organic per-compounds, bromates, nitrates, chlorates, chromates, iodates). In particular, the chemical-mechanical polishing system preferably does not comprise a component (e.g., metal ion, or compound) having a standard redox potential that is greater than the standard redox potential of the metal in an oxidized form and/or the standard redox potential of the reducing agent(s). More preferably, at a given pH for the chemical-mechanical polishing system, the polishing system does not comprise a component having a redox potential at such pH that is greater than the redox potential of the metal in an oxidized form at such pH and/or the redox potential of the reducing agent(s) at such pH. Alternatively, the chemical-mechanical polishing system can further comprise one or more redox stabilizers that kinetically stabilize the reducing agent and/or the other components of the polishing system so that the reducing agent and such other components do not react with each other (i.e., the reducing agent and the other components do not undergo a oxidation/reduction reaction) during the useful lifetime of the chemical-mechanical polishing system or during the time in which the substrate is being polished. For example, when the reducing agent comprises $Fe^{2+}$ ions, the chemical-mechanical polishing composition can further comprise water and dissolved oxygen, which could react with the $Fe^{2+}$ ions to produce a ferrous hydroxide, thereby preventing any reaction(s) with the other components of the polishing system. In another embodiment, the chemical-mechanical polishing composition can alternatively or additionally comprise a ligand that interacts with the $Fe^{2+}$ ions to produce a complex that prevents or retards any reaction(s) with the other components of the polishing system.

The chemical-mechanical polishing system optionally further comprises a chelating or complexing agent. The complexing agent is any suitable chemical additive that enhances the removal rate of the substrate layer being removed. Suitable chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). The choice of suitable chelating or complexing agents will depend on the type of substrate layer (e.g., the type of metal) being polished. It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof.

The chemical-mechanical polishing system can have any suitable pH. The pH of the chemical-mechanical polishing system can affect the redox potentials of both the reducing agent and the metal in an oxidized form. Accordingly, the pH of the chemical-mechanical polishing system can be selected to maximize the difference between the redox potential of the reducing agent and the redox potential of the metal in an oxidized form, thereby improving the thermodynamics of the reaction between the reducing agent and the metal in an oxidized form. Typically, the chemical-mechanical polishing system has a pH of about 13 or less. Preferably, the chemical-mechanical polishing system has a pH of about 7 or less (e.g., about 6 or less, about 5 or less, or about 4 or less). Typically, the chemical-mechanical polishing system has a pH of about 1 or more (e.g., about 2 or more).

The pH of the chemical-mechanical polishing system can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be potassium hydroxide, sodium hydroxide, ammonium hydroxide, or a combination thereof. The pH buffering agent can be any suitable buffering agent, for example, phosphates, acetates, borates, ammonium salts, and the like. The chemical-mechanical polishing system can comprise any suitable amount of a pH adjustor and/or a pH buffering agent, provided such amount is sufficient to achieve and/or maintain the pH of the polishing system within the ranges set forth herein.

The chemical-mechanical polishing system optionally further comprises a surfactant. Suitable surfactants can include, for example, cationic surfactants, anionic surfactants, nonionic surfactants, amphoteric surfactants, mixtures thereof, and the like. Preferably, the polishing system comprises a nonionic surfactant. One example of a suitable nonionic surfactant is an ethylenediamine polyoxyethylene surfactant. The amount of surfactant typically is about 0.0001 wt. % to about 1 wt. % (preferably about 0.001 wt. % to about 0.1 wt. %, or about 0.005 wt. % to about 0.05 wt. %) based on the weight of the liquid carrier and any components dissolved or suspended therein.

The chemical-mechanical polishing system optionally further comprises an antifoaming agent. The anti-foaming agent can be any suitable anti-foaming agent. Suitable antifoaming agents include, but are not limited to, silicon-based and acetylenic diol-based antifoaming agents. The amount of anti-foaming agent present in the polishing composition typically is about 40 ppm to about 140 ppm.

The chemical-mechanical polishing system optionally further comprises a biocide. The biocide can be any suitable biocide, for example an isothiazolinone biocide. The amount of biocide used in the polishing composition typically is about 1 to about 50 ppm, preferably about 10 to about 20 ppm.

The following examples further illustrate the invention but, of course, should not be construed as in any way limiting its scope.

EXAMPLE 1

This example demonstrates the enhanced polishing rate of a metal in an oxidized form exhibited by the method of the invention. Similar substrates comprising iridium oxide ($IrO_2$) were polished using seven different chemical-mechanical polishing systems (Polishing Systems 1A, 1B, 1C, 1D, 1E, 1F, and 1G). Polishing Systems 1A-1G each contained about 3 wt. % of an alumina abrasive comprising a mixture of about 60% α-alumina and about 40% fumed alumina, an amount of KOH or nitric acid sufficient to adjust the pH of the polishing system to about 3, and water. Polishing System 1A (comparative) did not contain a reducing agent. Polishing System 1B (invention) contained approximately 1 wt. % phosphorous acid ($H_3PO_3$) based on the weight of the liquid carrier and the components dissolved or suspended therein. Polishing System 1C (invention) contained approximately 1 wt. % hypophosphorous acid ($H_3PO_2$) based on the weight of the liquid carrier and the components dissolved or suspended therein. Polishing System 1D (invention) contained approximately 1 wt. % ascorbic acid based on the weight of the liquid carrier and the components dissolved or suspended therein. Polishing System 1E (invention) contained approximately 1 wt. % formic acid based on the weight of the liquid carrier and the components dissolved or suspended therein. Polishing System 1F (invention) contained approximately 1 wt. % pyrogallol (i.e., 1,2,3-trihydroxybenzene) based on the weight of the liquid carrier and the components dissolved or suspended therein. Polishing System 1G (invention) contained approximately 1 wt. % hydroquinone sulfonic acid based on the weight of the liquid carrier and the components dissolved or suspended therein. The values for the iridium oxide removal rate (in angstroms per minute) were measured for each of the polishing compositions. The results are summarized in Table 1.

TABLE 1

Iridium oxide removal rates.

| Polishing System | Reducing Agent | $IrO_2$ Removal Rate (Å/min) |
|---|---|---|
| 1A | — | 122 |
| 1B | Phosphorous Acid | 1200 |
| 1C | Hypophosphorous Acid | 1259 |
| 1D | Ascorbic Acid | 2223 |
| 1E | Formic Acid | 923 |
| 1F | Pyrogallol | 588 |
| 1G | Hydroquinone sulfonic acid | 639 |

These results demonstrate that the method of the invention exhibits a high removal rate for a metal in an oxidized form as compared to a similar method in which the polishing system does not comprise a reducing agent. In particular, the methods utilizing Polishing Systems 1B-1G each exhibited an iridium oxide removal rate that was at least 400% greater than the removal rate of a similar method utilizing a polishing system that did not comprise a reducing agent (i.e., Polishing System 1A). Indeed, the methods utilizing Polishing Systems 1B and 1C each exhibited an iridium oxide removal rate that was approximately 900% greater than the removal rate of the method utilizing Polishing System 1A.

EXAMPLE 2

This example demonstrates the enhanced polishing rate of a metal in an oxidized form exhibited by the method of the invention. Similar substrates comprising iridium oxide ($IrO_2$) were polished using four different chemical-mechanical polishing systems (Polishing Systems 2A, 2B, 2C, and 2D). Polishing Systems 2B-2D each contained about 1 wt. % ascorbic acid based on the weight of the liquid carrier and the components dissolved or suspended therein, an amount of KOH or nitric acid sufficient to adjust the pH of the polishing system to about 3, and water. Polishing System 2A (comparative) contained approximately 3 wt. % of an abrasive comprising a mixture of about 60% α-alumina and about 40% fumed alumina, but did not contain ascorbic acid. Polishing System 2B (invention) contained approximately 8 wt. % of a silica abrasive. Polishing System 2C (invention) contained approximately 8 wt. % of a fumed alumina abrasive, and Polishing System 2D (invention) contained approximately 3 wt. % of an abrasive comprising a mixture of about 60% α-alumina and about 40% fumed alumina. The values for the iridium oxide removal rate (in angstroms per minute) were measured for each of the polishing compositions. The results are summarized in Table 2.

TABLE 2

Iridium oxide removal rates.

| Polishing System | Reducing Agent | Abrasive | Amount of Abrasive (wt. %) | Iridium Oxide Removal Rate (Å/min) |
|---|---|---|---|---|
| 2A | — | Fumed alumina and α-alumina | 3 | 122 |
| 2B | Ascorbic acid | Silica | 8 | 1537 |
| 2C | Ascorbic acid | Fumed alumina | 8 | 1695 |
| 2D | Ascorbic acid | Fumed alumina and α-alumina | 3 | 2223 |

These results demonstrate that the method of the invention exhibits a high removal rate for a metal in an oxidized form as compared to a similar method in which the polishing system does not comprise a reducing agent. In particular, the methods utilizing Polishing Systems 2B-2D each exhibited an iridium oxide removal rate that was at least about 1200% greater than the removal rate of a similar method utilizing a polishing system that did not comprise a reducing agent (i.e., Polishing System 2A). These results further demonstrate that the identity of the abrasive contained in the chemical-mechanical polishing system can impact the polishing rate of the method. For example, a comparison of the iridium oxide polishing rates exhibited by the methods utilizing Polishing Systems 2C and 2D reveals that a polishing system comprising α-alumina can be utilized to polish a similar substrate at a higher rate than a polishing system only comprising fumed alumina.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for polishing a substrate comprising a metal in an oxidized form, the method comprising the steps of:
   (a) providing a substrate comprising a metal in an oxidized form, wherein the metal is a noble metal selected from the group consisting of platinum, iridium, ruthenium, rhodium, palladium, silver, osmium, gold, and combinations thereof,
   (b) contacting a portion of the substrate with a chemical-mechanical polishing system comprising:
      (i) a polishing component selected from the group consisting of an abrasive, a polishing pad, and a combination thereof,
      (ii) about 0.1 to about 1 wt. % of a reducing agent based on the weight of the liquid carrier and any components dissolved or suspended therein, wherein the reducing agent is ascorbic acid, and
      (iii) a liquid carrier, and
   (c) abrading at least a portion of the metal in an oxidized form to polish the substrate.

2. The method of claim 1, wherein the chemical-mechanical polishing system comprises about 0.1 to about 0.5 wt. % ascorbic acid based on the weight of the liquid carrier and any components dissolved or suspended therein.

3. The method of claim 1, wherein the polishing system has a pH of about 1 to about 7.

4. The method of claim 3, wherein the chemical-mechanical polishing system has a pH of about 2 to about 5.

5. The method of claim 1, wherein the oxidized form is selected from the group consisting of oxides, nitrides, borides, sulfides, and mixtures thereof.

6. The method of claim 5, wherein the oxidized form is an oxide, and the metal in an oxidized form has a molecular formula $M_xO_y$ in which M represents the metal and x and y represent integers, where y is greater than or equal to x.

7. The method of claim 6, wherein the metal in an oxidized form is iridium oxide.

8. The method of claim 1, wherein the chemical-mechanical polishing system comprises an abrasive suspended in the liquid carrier, and the abrasive comprises a metal oxide selected from the group consisting of alumina, silica, ceria, zirconia, titania, germania, co-formed products thereof, and combinations thereof.

9. The method of claim 8, wherein the abrasive comprises silica, fumed alumina, or a combination thereof.

10. The method of claim 8, wherein the abrasive comprises α-alumina.

11. The method of claim 10, wherein the abrasive further comprises fumed alumina.

12. The method of claim 10, wherein α-alumina comprises about 60 wt. % or more of the abrasive based on the total weight of the abrasive.

13. The method of claim 11, wherein α-alumina comprises about 60 wt. % or more of the abrasive based on the total weight of the abrasive.

14. The method of claim 1, wherein the chemical-mechanical polishing system further comprises a complexing agent.

15. The method of claim 1, wherein the chemical-mechanical polishing system further comprises a pH buffering agent.

16. The method of claim 1, wherein the chemical-mechanical polishing system further comprises a surfactant.

17. The method of claim 1, wherein the liquid carrier is water.

18. The method of claim 17, wherein the oxidized form is selected from the group consisting of oxides, nitrides, borides, sulfides, and mixtures thereof.

19. The method of claim 18, wherein the oxidized form is an oxide, and the metal in an oxidized form has a molecular formula $M_xO_y$, in which M represents the metal and x and y represent integers, where y is greater than or equal to x.

20. The method of claim 19, wherein the metal in an oxidized form is iridium oxide.

21. The method of claim 17, wherein the chemical-mechanical polishing system comprises an abrasive suspended in the liquid carrier, and the abrasive comprises a metal oxide selected from the group consisting of alumina, silica, ceria, zirconia, titania, germania, co-formed products thereof, and combinations thereof.

22. The method of claim 21, wherein the abrasive comprises silica, fumed alumina, or a combination thereof.

23. The method of claim 21, wherein the abrasive comprises α-alumina.

24. The method of claim 23, wherein the abrasive further comprises fumed alumina.

25. The method of claim 23, wherein α-alumina comprises about 60 wt. % or more of the abrasive based on the total weight of the abrasive.

26. The method of claim 24, wherein α-alumina comprises about 60 wt. % or more of the abrasive based on the total weight of the abrasive.

27. The method of claim 17, wherein the chemical-mechanical polishing system further comprises a complexing agent.

28. The method of claim 17, wherein the chemical-mechanical polishing system further comprises a pH buffering agent.

29. The method of claim 17, wherein the chemical-mechanical polishing system further comprises a surfactant.

30. The method of claim 17, wherein the chemical-mechanical polishing system has a pH of about 2 to about 5.

* * * * *